US011456709B2

(12) United States Patent
Wang

(10) Patent No.: US 11,456,709 B2
(45) Date of Patent: Sep. 27, 2022

(54) TRANSCONDUCTANCE AMPLIFIER AND CHIP

(71) Applicant: SHENZHEN GOODIX TECHNOLOGY CO., LTD., Guangdong (CN)

(72) Inventor: Wen-Chi Wang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/115,606

(22) Filed: Dec. 8, 2020

(65) Prior Publication Data

US 2021/0099138 A1 Apr. 1, 2021

Related U.S. Application Data

(63) Continuation-in-part of application No. PCT/CN2019/108025, filed on Sep. 26, 2019.

(51) Int. Cl.
*H03F 1/32* (2006.01)
*H03F 3/45* (2006.01)

(52) U.S. Cl.
CPC ........... *H03F 1/32* (2013.01); *H03F 3/45076* (2013.01); *H03F 3/45183* (2013.01)

(58) Field of Classification Search
CPC .. H03F 1/32; H03F 2200/453; H03F 2200/91; H03F 2203/45112;
(Continued)

(56) References Cited

U.S. PATENT DOCUMENTS 6,246,152 B1 * 6/2001 Fontanella ............ H03F 3/3028
310/317
2019/0173442 A1 6/2019 Segarra

FOREIGN PATENT DOCUMENTS

CN 101001078 A 7/2007
CN 101034873 A 9/2007
(Continued)

OTHER PUBLICATIONS

Troy Stockstad and Hirokazu Yoshizawa, "A 0.9-V, 0.5-µA, rail-to-rail CMOS operational amplifier", IEEE Journal of Solid-State Circuits, p. 286-292, vol. 37, Issue: 3, Mar. 2002.
(Continued)

*Primary Examiner* — Samuel S Outten
*Assistant Examiner* — Khiem D Nguyen
(74) *Attorney, Agent, or Firm* — WPAT, P.C., Intellectual Property Attorneys; Anthony King

(57) ABSTRACT

The present application discloses a transconductance amplifier and a related chip. The transconductance amplifier is configured to generate an output current according to a positive input voltage and a negative input voltage, wherein the transconductance amplifier includes: an input stage, configured to receive the positive input voltage and the negative input voltage and generate a positive output current and a negative output current, wherein the input stage includes: a first transistor, wherein a gate thereof is coupled to the positive input voltage; a second transistor, wherein a gate thereof is coupled to the negative input voltage; a first resistor, serially connected between the first transistor and the second transistor; a third transistor, wherein a source of the third transistor is coupled between the first resistor and the first transistor, and a drain of the third transistor is configured to output the positive output current; and a fourth transistor.

16 Claims, 7 Drawing Sheets

(58) Field of Classification Search
CPC . H03F 2203/45156; H03F 2203/45322; H03F 2203/45626; H03F 1/0205; H03F 1/3211; H03F 3/45197; H03F 3/45206; H03F 3/45475; H03F 3/4508; H03F 3/45183; H03F 1/0222; H03F 3/45076
USPC .............................. 330/253, 254, 255, 261
See application file for complete search history.

(56) References Cited

FOREIGN PATENT DOCUMENTS

| | | |
|---|---|---|
| CN | 102545806 A | 7/2012 |
| CN | 106208984 A | 12/2016 |

OTHER PUBLICATIONS

English abstract of CN101034873A.
English abstract of CN102545806A.
English abstract of CN106208984A.
English abstract of CN101001078A.
As-filed PCT Request of PCT/CN2019/108025.
As-filed PCT Application of PCT/CN2019/108025.
International Searching Authority (ISA) Form 210—International Search Report of PCT/CN2019/108025.
International Searching Authority (ISA) Form 237—Written Opinion of PCT/CN2019/108025.
Notification of the International Application No. and of the International Filing Date—Form 105 of PCT/CN2019/108025.

\* cited by examiner

TRANSCONDUCTANCE AMPLIFIER AND CHIP

CROSS REFERENCE TO RELATED APPLICATIONS

The present application is a continuation-in-part of international application No. PCT/CN2019/108025, filed on Sep. 26, 2019, which is hereby incorporated by reference in its entirety.

TECHNICAL FIELD

The present application relates to a transconductance amplifier and a chip; in particular, a transconductance amplifier and a chip capable of improving the accuracy and linearity of the transconductance amplifier.

BACKGROUND

For conventional transconductance amplifiers, an AC voltage is applied between a gate and a source of a transistor of an input stage, and drain current thus-generated is affected by the transconductance of the transistor of said input stage, and since the current flows through the transistor of said input stage, it causes an error in such transconductance amplifier. Also, due to the non-linearity characteristic of the transconductance of the transistor of such input stage, the linearity of said transconductance amplifier deteriorates accordingly, and in addition, the power consumption of the conventional transconductance amplifiers needs to be further improved. in light of the above, how to improve the above mentioned issues has become an important working item in this field.

SUMMARY OF THE INVENTION

One purpose of the present application is to disclose a transconductance and a chip to address the above-mentioned issue.

One embodiment of the present application discloses a transconductance amplifier, which is configured to generate an output current according to a positive input voltage and a negative input voltage, wherein the transconductance amplifier includes: an input stage, configured to receive the positive input voltage and the negative input voltage and generate a positive output current and a negative output current, wherein the input stage includes: a first transistor, wherein a gate thereof is coupled to the positive input voltage; a second transistor, wherein a gate thereof is coupled to the negative input voltage; a first resistor, serially connected between the first transistor and the second transistor; a third transistor, wherein a source of the third transistor is coupled between the first resistor and the first transistor, and a drain of the third transistor is configured to output the positive output current; and a fourth transistor, wherein a source of the fourth transistor is coupled between the first resistor and the second transistor, and a drain of the fourth transistor is configured to output the negative output current; and output stage, configured to generate the output current according to the positive output current and the negative output current.

One embodiment of the present application discloses a chip, which includes the above-mentioned transconductance amplifier.

Embodiments of the present application improves the transconductance amplifier to increase the accuracy and reduce the power consumption.

DETAILED DESCRIPTION

Figure 1:
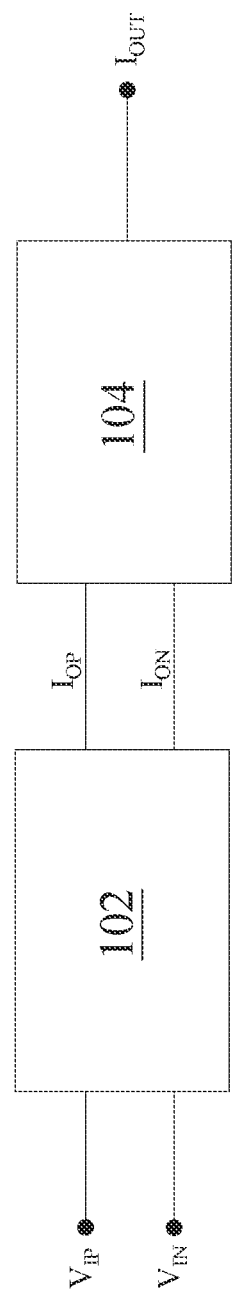
FIG. 1 is a schematic diagram illustrating a transconductance amplifier according to the first embodiment of the present application.

The following disclosure provides many different embodiments, or examples, for implementing different features of the invention. Specific examples of components and arrangements are described below to simplify the present disclosure. As could be appreciated, these are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath, " "below, " "lower, " "above," "upper," and the like, may be used herein for the ease of the description to describe one element or feature's relationship with respect to another element(s) or feature(s) as illustrated in the drawings. The spatially relative terms are intended to encompass different orientations of the device in use or operation in addition to the orientation depicted in the figures. The apparatus may be otherwise oriented (e.g., rotated by 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about"

means within an acceptable standard error of the mean when considered by one of ordinary skill in the art. As could be appreciated, other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed considering the number of reported significant digits and by applying ordinary rounding techniques. Ranges can be expressed herein as from one endpoint to another endpoint or between two endpoints. All ranges disclosed herein are inclusive of the endpoints unless specified otherwise.

Transconductance amplifiers are applied in various circuits. The input of the transconductance amplifier is voltage and the output is current. The transconductance of the transconductance amplifier is defined as the quotient of the output current divided by the input voltage. Specifically, the AC voltage is applied between the gate and source of the transistor of the input stage of conventional transconductance amplifiers, and the drain current thus-generated is affected by the transconductance of the transistor of said input stage, and since the current flows through the transistor of said input stage, it causes an error in such transconductance amplifiers. Also, due to the non-linearity characteristic of the transconductance of the transistor of such input stage, the linearity of said transconductance amplifier deteriorates accordingly. Moreover, a fixed size of bias current is consumed regardless of the amount of output current of the conventional transconductance amplifiers, so the power consumption of the conventional transconductance amplifiers needs to be further improved.

The transconductance amplifier of the present application reduces the error of the transconductance amplifier and increases the linearity thereof by rearrangement of the transistors in the input stage. Moreover, the power consumption of the transconductance amplifier can be improved by means of an extra bias current control circuit.

FIG. 1 is a schematic diagram illustrating a transconductance amplifier according to the first embodiment of the present application. The transconductance amplifier 100 is configured to generate an output current $I_{OUT}$ according to a positive input voltage $V_{IP}$ and a negative input voltage $V_{IN}$. The transconductance amplifier 100 includes an input stage 102 and an output stage 104. The input stage 102 receive the positive input voltage $V_{IP}$ and the negative input voltage $V_{IN}$ and generates a positive output current $I_{OP}$ and a negative output current $I_{ON}$, and the output stage 104 generates an output current $I_{OUT}$ according to the positive output current $I_{OP}$ and the negative output current $I_{ON}$. In the present embodiment, the transconductance amplifier 100 is a rail-to-rail input/output transconductance amplifier.

Figure 2:
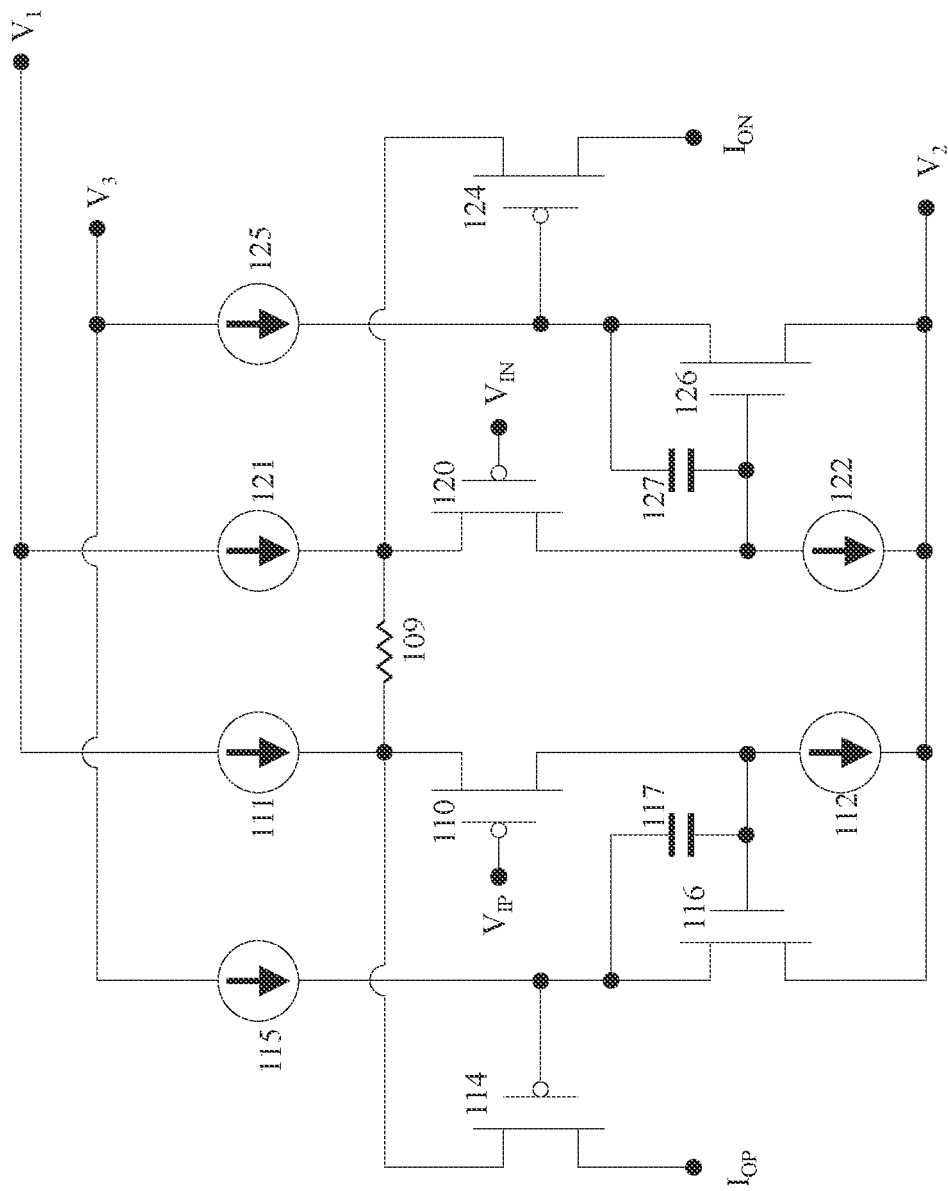
FIG. 2 is a schematic diagram illustrating an embodiment of the input stage of the transconductance amplifier of FIG. 1.

FIG. 2 is a schematic diagram illustrating an embodiment of the input stage of the transconductance amplifier of FIG. 1. The input stage 102 shown in FIG. 2 includes a first transistor 110, a second transistor 120, a first resistor 109, a third transistor 114, a fourth transistor 124, a fifth transistor 116, a sixth transistor 126, a first current source, a second current source 121, a third current source 112, a fourth current source 122, a seventh current source 115, an eighth current source 125, a first capacitor 117 and a second capacitor 127.

In the present embodiment and subsequent description, the first transistor 110, the second transistor 120, the third transistor 114 and the fourth transistor 124 are P-type transistors; the fifth transistor 116 and the sixth transistor 126 are N-type transistors. Yet the present application is not limited thereto, in some embodiments, it is also feasible to modify the input stage 102 to alter the polarity of the transistors therein. For example, the first transistor 110, the second transistor 120, the third transistor 114 and the fourth transistor 124 are changed into P-type transistors; and the fifth transistor 116 and the sixth transistor 126 are changed into N-type transistors.

In the present embodiment, the transconductance amplifier 100 is a rail-to-rail input/output transconductance amplifier, and therefore, in the input stage 102 shown in FIG. 2, the first reference voltage $V_1$ is greater than the third reference voltage $V_3$, and the third reference voltage $V_3$ is greater than the second reference voltage $V_2$. Specifically, the first reference voltage $V_1$ is twice the value of the third reference voltage $V_3$, the second reference voltage $V_2$ is the ground voltage. Yet, the present application is not limited thereto.

As shown in FIG. 2, the gate of the first transistor 110 is coupled to the positive input voltage $V_{IP}$, and the gate of the second transistor 120 is coupled to the negative input voltage $V_{IN}$, the first resistor 109 is serially connected between the first transistor 110 and the second transistor 120 and has a resistance $R_1$; specifically, one end of the first resistor 109 is coupled to the source of the first transistor 110, and the other end of the first resistor 109 is coupled to the source of the second transistor 120. The source of the third transistor 114 is coupled to the source of the first transistor 110, and the drain of the third transistor 114 is configured to output the positive output current $I_{OP}$; the source of the fourth transistor 124 is coupled to the source of the second transistor 120, the drain of the fourth transistor 124 is configured to output the negative output current $I_{ON}$.

The first current source 111 is coupled between the first reference voltage $V_1$ and the source of the first transistor 110 and configured to generate a first bias current flowing from the first reference voltage $V_1$ to the source of the first transistor 110; the second current source 112 is coupled between the second reference voltage $V_2$ and the drain of the first transistor 110 and is configured to generate a second bias current flowing from the drain of the first transistor 110 to the second reference voltage $V_2$; the third current source 121 is coupled between the first reference voltage $V_1$ and the source of the second transistor 120 and is configured to generate a third bias current flowing from the first reference voltage $V_1$ to the source of the second transistor 120; the fourth current source 122 is coupled between the second reference voltage $V_2$ and the drain of the second transistor 120 and is configured to generate a fourth bias current flowing from the drain of the second transistor 120 to the second reference voltage $V_2$. In this embodiment, the first bias current is greater than the second bias current, and the third bias current is greater than the fourth bias current.

In the present embodiment, the voltage difference between the positive input voltage $V_{IP}$ and the negative input voltage $V_{IN}$ does not affect the source to drain current of the first transistor 110 and the second transistor 120. In other words, voltage difference between the source of the first transistor 110 and the source of the second transistor 120 (i.e., the voltage difference between two ends of the first resistor 109) is the same as the voltage difference between the positive input voltage $V_{IP}$ and the negative input voltage $V_{IN}$, and will not be affected by the transconductance of the first transistor 110 and/or the transconductance of the second transistor 120; and voltage difference between the source of the third transistor 114 and the source of the fourth transistor 124 is also the same as the voltage difference between the source of the first transistor 110 and the source of the second transistor 120. Therefore, the difference between the positive output current $I_{OP}$ and the negative output current $I_{ON}$ (that is, $I_{OP}-I_{ON}$) is fixed as $2*(V_{IP}-V_{IN})/R_1$. In this way, the transconductance of the first transistor 110 and/or the transconductance of the second transistor 120 will no contribute errors to the output current $I_{OUT}$ of the transconductance amplifier 100, and hence, the issue associated with the poor linearity of the transconductance of the first transistor 110 and the transconductance of the second transistor 120 will not affect the linearity of the transconductance amplifier 100.

FIG. 2 further includes a fifth transistor 116, a sixth transistor 126, a seventh current source 115, an eighth current source 125, a first capacitor 117, and a second capacitor 127. In the present embodiment, the fifth transistor 116 and the sixth transistor 126 are N-type transistors, however, the present application is not limited thereto. The drain of the fifth transistor 116 is coupled to the gate of the third transistor 114, the source of the fifth transistor 116 is coupled to the second reference voltage $V_2$, the gate of the fifth transistor 116 is coupled to the drain of the first transistor 110; the drain of the sixth transistor 126 is coupled to the gate of the fourth transistor 124, the source of the sixth transistor 126 is coupled to the second reference voltage $V_2$, the gate of the sixth transistor 126 is coupled to the drain of the second transistor 120; the first capacitor 117 is coupled between the gate and drain of the fifth transistor 116; the second capacitor 127 is coupled between the gate and drain of the sixth transistor 126. The first capacitor 117 and the second capacitor 127 are used as loop compensation. The seventh current source 115 is coupled between the third reference voltage $V_3$ and the drain of the fifth transistor 116; the eighth current source 125 is coupled between the third reference voltage $V_3$ and the drain of the sixth transistor 126.

Figure 3:
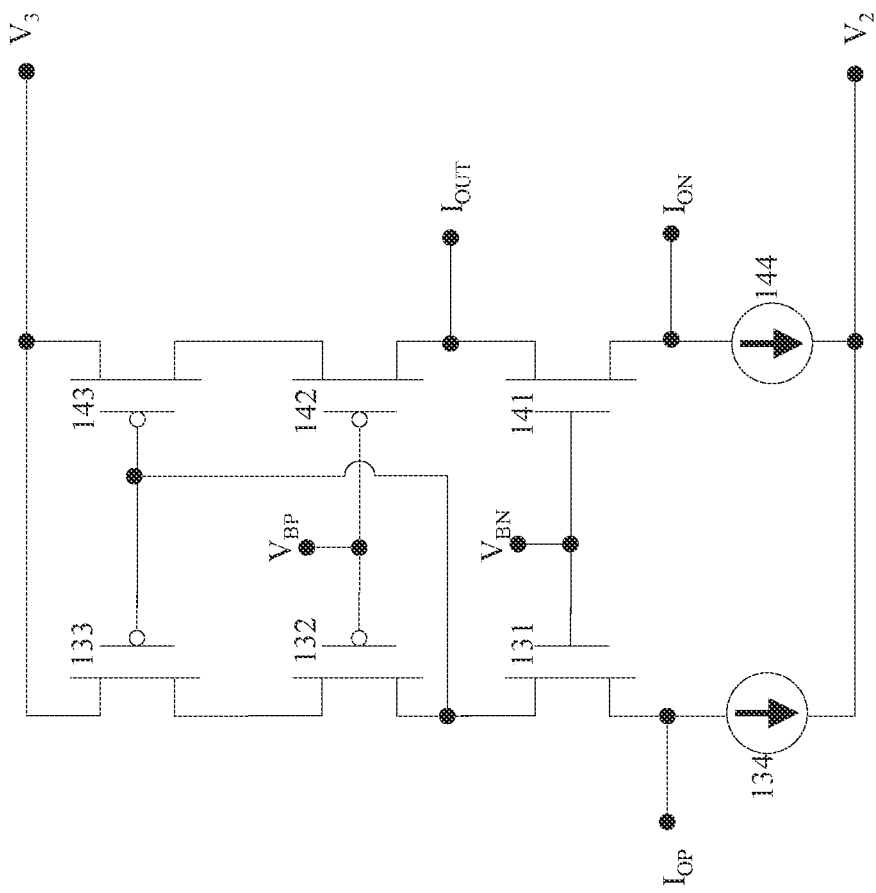
FIG. 3 is a schematic diagram illustrating an embodiment of the output stage of the transconductance amplifier of FIG. 1.

FIG. 3 is a schematic diagram illustrating the output stage of the transconductance amplifier according to the embodiment of FIG. 1. The output stage 104 of the transconductance amplifier 100 shown in FIG. 3 includes a seventh transistor 131, an eighth transistor 141, a ninth current source 134, a tenth current source 144 and transistors 132, 133, 142, 143. In this case, the seventh transistor 131 and the eighth transistor 141 are N-type transistors, whereas transistors 132, 133, 142, 143 are P-type transistors; however, the present application is not limited thereto.

The source of the seventh transistor 131 is coupled to the drain of the third transistor 114 of the input stage 102 of the transconductance amplifier 100 and is configured to the receive positive output current $I_{OP}$; the source of the eighth transistor 141 is coupled to the drain of the fourth transistor 124 of the input stage 102 of the transconductance amplifier 100 and is configured to receive the negative output current $I_{ON}$. The gate of the seventh transistor 131 is coupled to the gate of the eighth transistor 141, and then coupled to the reference voltage $V_{BN}$, together. The ninth current source 134 is coupled between the source of the seventh transistor 131 and the second reference voltage $V_2$ and is configured to generate a ninth bias current; the tenth current source 144 is coupled between the source of the eighth transistor 141 and the second reference voltage $V_2$ and is configured to generate a tenth bias current.

The drain of the transistor 132 is coupled to the drain of the seventh transistor 131, the source of the transistor 132 is coupled to the drain of the transistor 133, the source of the transistor 133 is coupled to the third reference voltage $V_3$, the drain of the transistor 142 is coupled to the drain of the eighth transistor 141, the source of the transistor 142 is coupled to the drain of the transistor 143, the source of the transistor 143 is coupled to the third reference voltage $V_3$, the gate of the transistor 132 is coupled to the gate of the transistor 142, and then are coupled to the reference voltage $V_{BP}$ together. The gate of the transistor 133 is coupled to the gate of the transistor 143, and then are coupled to the drain of the transistor 132 together. The transistor 133 and transistor 143 form a current mirror circuit and convert the positive output current $I_{OP}$ and the negative output current $I_{ON}$ into the output current $I_{OUT}$, which is outputted from where between the drain of the eighth transistor 141 and the drain of the transistor 142.

Figure 4:
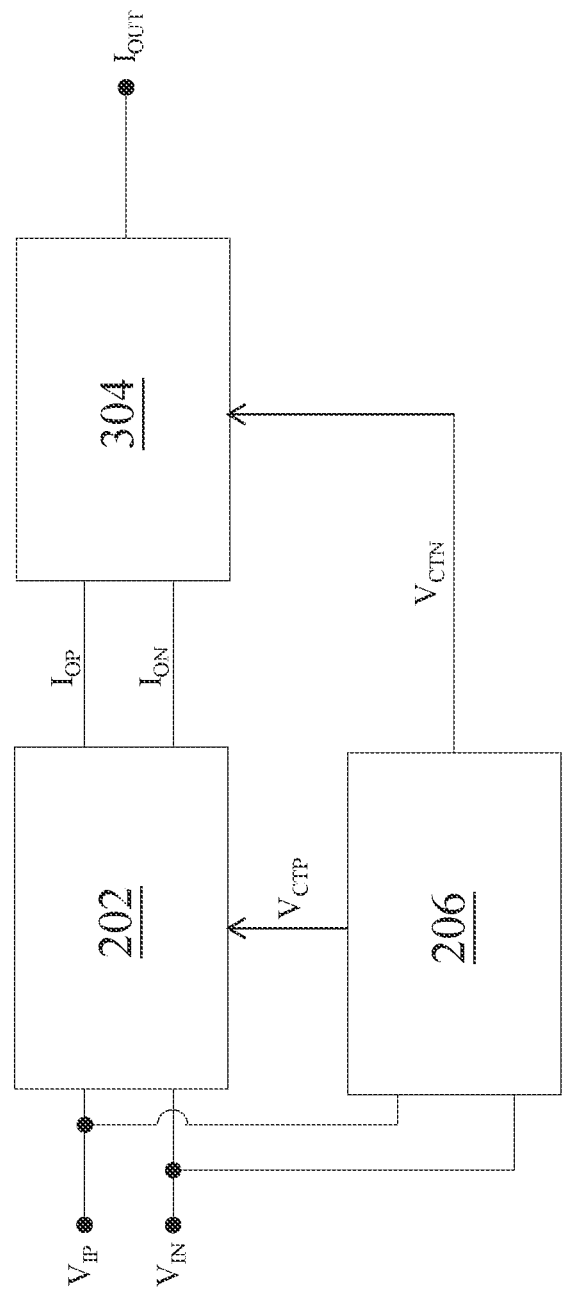
FIG. 4 is a schematic diagram illustrating a transconductance amplifier according to the second embodiment of the present application.

FIG. 4 is a schematic diagram illustrating a transconductance amplifier according to the second embodiment of the present application. The transconductance amplifier 200 is configured to generate an output current $I_{OUT}$ according to a positive input voltage $V_{IP}$ and a negative input voltage $V_{IN}$. The transconductance amplifier 200 differs from the transconductance amplifier 100 in that it further includes a bias current control circuit 206, and in response to the addition of such bias current control circuit 206, the input stage 102 is modified to an input stage 202, and the output stage 104 is modified to an output stage 304. The input stage 202 receives the positive input voltage $V_{IP}$ and the negative input voltage $V_{IN}$ and generates a positive output current $I_{OP}$ and a negative output current $I_{ON}$, whereas the output stage 104 generates an output current $I_{ON}$ according to the positive output current $I_{OP}$ and the negative output current $I_{ON}$. The bias current control circuit 206 generates a first control voltage $V_{CTP}$ according to the positive input voltage $V_{IP}$ and the negative input voltage $V_{IN}$, which is configured to adjust the value of the bias current in the input stage 202. In short, when the voltage difference between the positive input voltage $V_{IP}$ and the negative input voltage $V_{IN}$ is greater, the output current $I_{OUT}$ from the transconductance amplifier 200 is also greater, and hence the input stage 202 has to use a greater bias current. Therefore, the bias current control circuit 206 would determine the bias current of the input stage 202 according to the voltage difference between the positive input voltage $V_{IP}$ and the negative input voltage $V_{IN}$; compared to the cases which does not use the bias current control circuit 206, wherein the input stage 102 needs a fixed size of bias current regardless of the voltage difference between the positive input voltage $V_{IP}$ and the negative input voltage $V_{IN}$, the embodiment shown in FIG. 4 ma further reduce the power consumption of the input stage 202.

The bias current control circuit 206 of the transconductance amplifier 200 further generates a second control voltage $V_{CTN}$ according to the positive input voltage $V_{IP}$ and the negative input voltage $V_{IN}$, which is configured to adjust the value of the bias current in the output stage 304, and in response to it, the output stage 104 is also modified as the output stage 304. In short, when the voltage difference between the positive input voltage $V_{IP}$ and the negative input voltage $V_{IN}$ is greater, the output current $I_{OUT}$ from the transconductance amplifier 200 is also greater, and hence the output stage 304 has to use a greater bias current. Therefore, the bias current control circuit 206 would determine the bias current of the output stage 304 according to the voltage difference between the positive input voltage $V_{IP}$ and the negative input voltage $V_{IN}$; compared to the cases which does not use the bias current control circuit 206, wherein the output stage 104 needs a fixed size of bias current regardless of the voltage difference between the positive input voltage $V_{IP}$ and the negative input voltage $V_{IN}$, the embodiment shown in FIG. 4 may further reduce the power consumption of the output stage 304.

Figure 5:
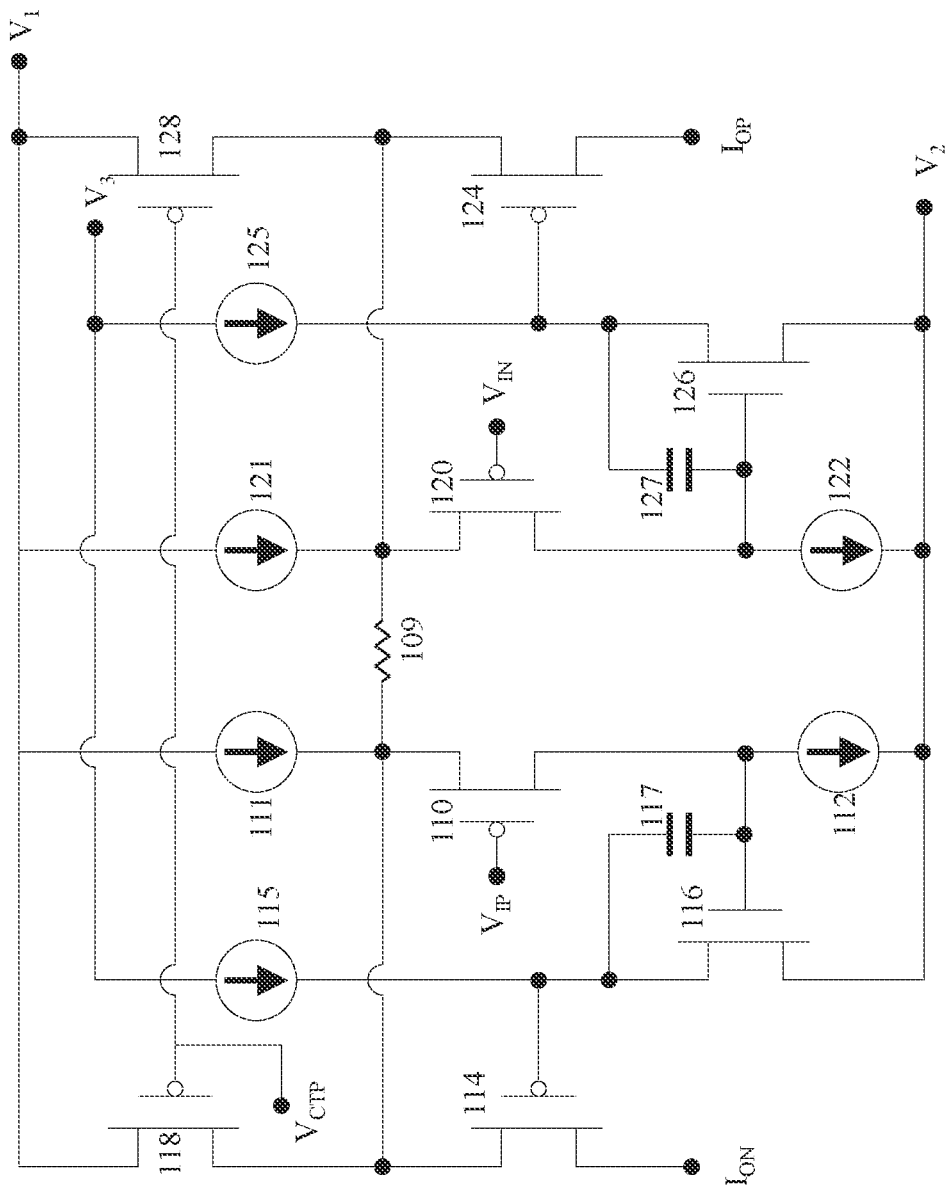
FIG. 5 is a schematic diagram illustrating an embodiment of the input stage of the transconductance amplifier of FIG. 4.

FIG. 5 is a schematic diagram illustrating an embodiment of the input stage 202 of the transconductance amplifier 200 of FIG. 4. The input stage 202 differs from the input stage 102 shown in FIG. 2 in that it further includes a transistor 118 and a transistor 128. In the present embodiment, the transistor 118 and the transistor 128 are P-type transistors, yet the present application is not limited thereto. The source of the transistor 118 is coupled to the first reference voltage $V_1$, the drain of the transistor 118 is coupled to the source of the third transistor 114, the source of the transistor 128 is coupled to the first reference voltage $V_1$, the drain of the transistor 128 is coupled to the source of the fourth transistor 124, the gates of the transistor 118 and the transistor 128 are subject to the control of the first control voltage $V_{CTP}$ so as to adjust the value of the fifth bias current and the sixth bias current, thereby reducing the power consumption of the input stage 202.

Figure 6:
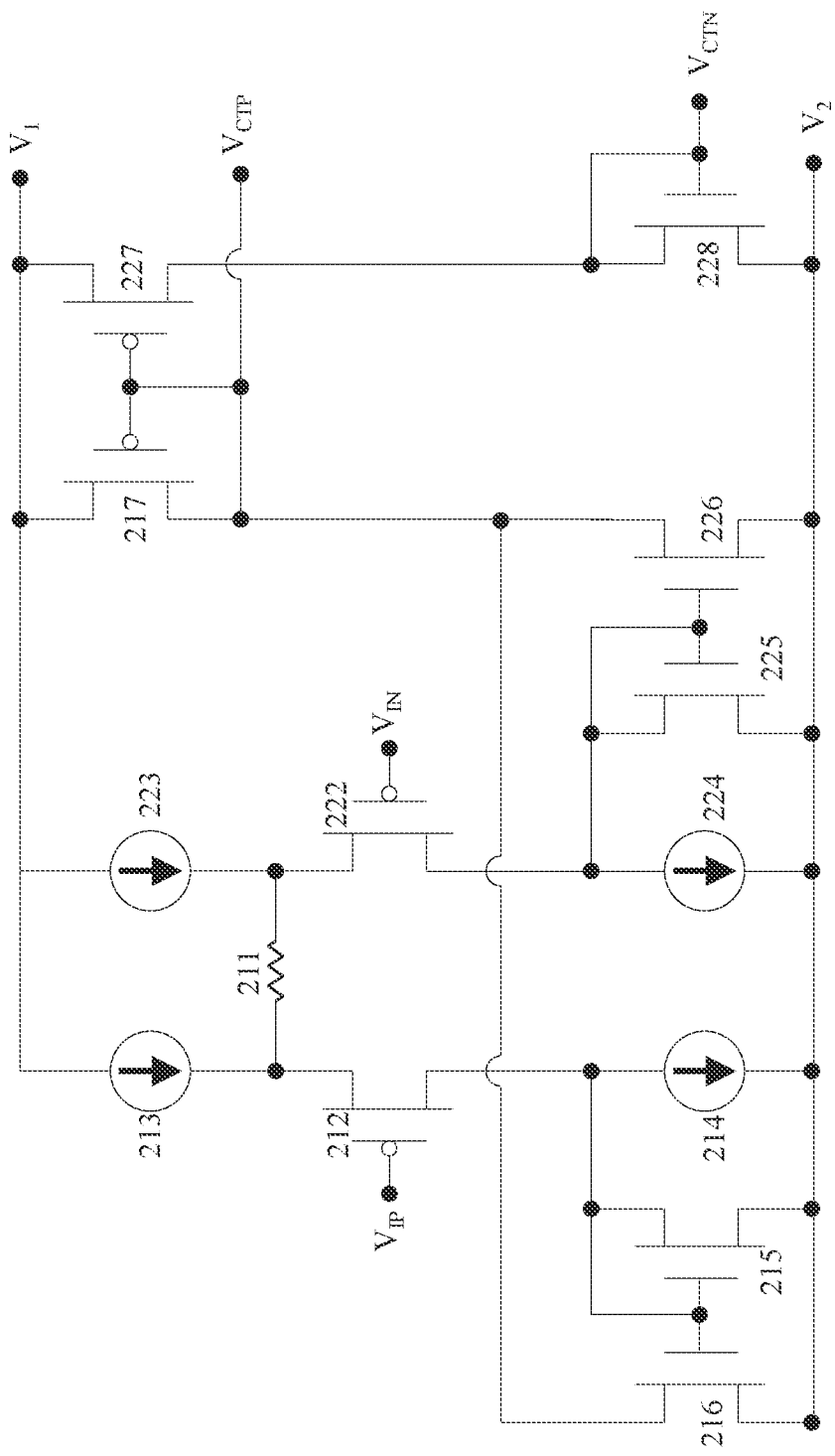
FIG. 6 is a schematic diagram illustrating an embodiment of the bias current control circuit of FIG. 4.

FIG. 6 is a schematic diagram illustrating an embodiment of the bias current control circuit 206 of the transconductance amplifier 200 of FIG. 4. The bias current control circuit 206 includes a ninth transistor 212, a tenth transistor 222, a second resistor 211, an eleventh current source 213, a twelfth current source 214, a thirteenth current source 223, a fourteenth current source 224 and transistors 215, 216, 225, 226, 217, 227, 228. In the present embodiment, the ninth transistor 212, the tenth transistor 222, transistors 217 and 227 are P-type transistors, whereas the transistors 215, 216, 225, 226 and 228 are N-type transistors, yet the present application is not limited thereto.

As shown in FIG. 6, the gate of the ninth transistor 212 is coupled to the positive input voltage $V_{IP}$, the gate of the tenth transistor 222 is coupled to the negative input voltage $V_{IN}$, and the second resistor 211 is serially connected between the ninth transistor 212 and the tenth transistor 222 and has a resistance $R_2$. Specifically, one end of the second resistor 211 is coupled to the source of the ninth transistor 212, and the other end of the second resistor 211 is coupled to the source of the tenth transistor 222.

The eleventh current source 213 is coupled between the first reference voltage $V_1$ and the source of the ninth transistor 212 and is configured to generate an eleventh bias current flowing from the first reference voltage $V_1$ to the source of the ninth transistor 212; the twelfth current source 214 is coupled between the second reference voltage $V_2$ and the drain of the ninth transistor 212 and is configured to generate a twelfth bias current flowing from the drain of the ninth transistor 212 to the second reference voltage $V_2$; the thirteenth current source 223 is coupled between the first reference voltage $V_1$ and the source of the tenth transistor 222 and is configured to generate a thirteenth bias current flowing from the first reference voltage $V_1$ to the source of the tenth transistor 222; the fourteenth current source 224 is coupled between the second reference voltage $V_2$ and the drain of the tenth transistor 222 and is configured to generate a fourteenth bias current flowing from the drain of the tenth transistor 222 to the second reference voltage $V_2$. In this embodiment, the eleventh bias current is greater than the twelfth bias current, and the thirteenth bias current is greater than the fourteenth bias current.

Unlike the arrangement of the input stage 102 or 202, the source to drain current from the ninth transistor 212 and the tenth transistor 222 of the bias current control circuit 206 is not fixed, and hence, the voltage difference between the positive input voltage $V_{IP}$ and the negative input voltage $V_{IN}$ is reflected on the twelfth bias current of the twelfth current source 214 and the fourteenth bias current of the fourteenth current source 224. Because the bias current control circuit 206 is only configured to generate the first control voltage $V_{CTP}$ rather than being used as the input stage, the error resulted from the transconductance of the ninth transistor 212 and the tenth transistor 222 would not deteriorate the overall accuracy. The transistors 215 and 216 form the first current mirror circuit, transistors 225 and 226 form the second current mirror circuit, and the transistor 217 and the transistor 227 form the third current mirror circuit. The current difference between drain current of the ninth transistor 212 and the drain current of the tenth transistor 222 would reflect on the drain current of the transistor 217 through the first current mirror circuit and the second current mirror circuit, and also reflect on the drain current of the transistor 227 through the third current mirror circuit. In this way, the gate voltage of the transistor 227 can be used as the first control voltage $V_{CTP}$.

Figure 7:
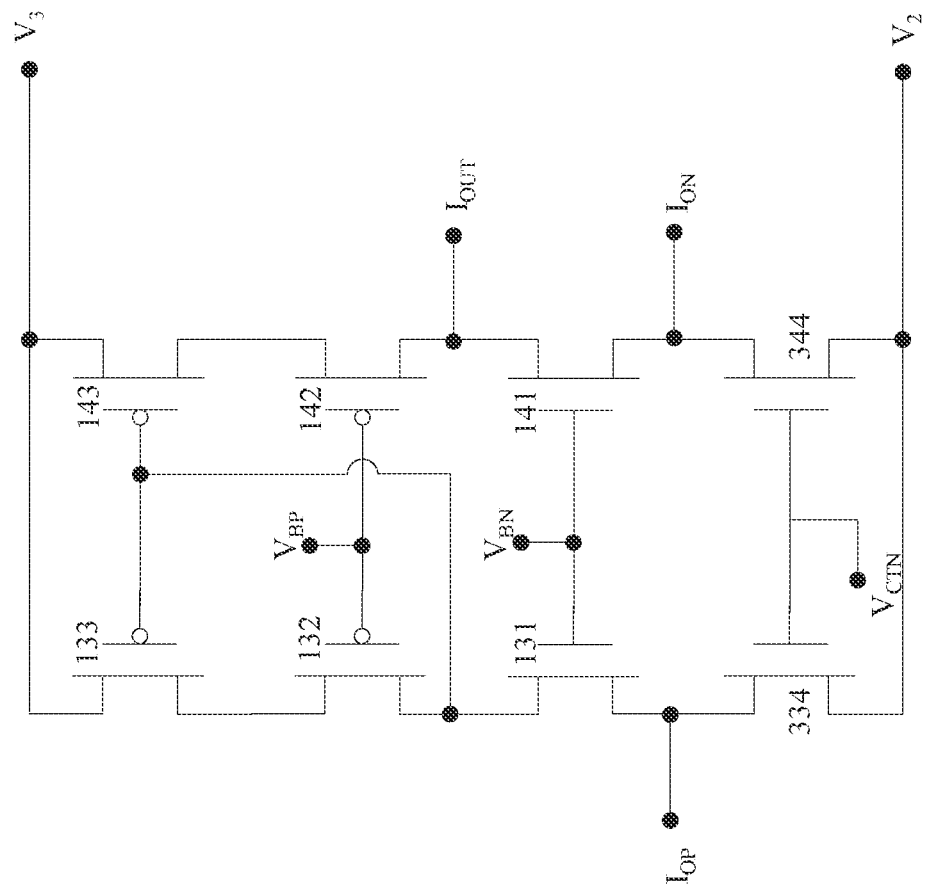
FIG. 7 is a schematic diagram illustrating an embodiment of the output stage of the transconductance amplifier of FIG. 4.

Regarding the bias current control circuit 206 shown in FIG. 4, the gate voltage of the transistor 228 can be used as the second control voltage $V_{CTN}$. FIG. 7 is a schematic diagram illustrating the output stage 304 of the transconductance amplifier 200 according to the embodiment of FIG. 4. The output stage 304 differs from the output stage 104 shown in FIG. 3 in that the ninth current source 134 and the tenth current source 144 of the output stage 104 in FIG. 3 are respectively implemented as a transistor 334 and a transistor 344 of the output stage 304 in FIG. 7. In the present embodiment, the transistor 334 and the transistor 344 are N-type transistors, yet the present application is not limited thereto. The source of the transistor 334 is coupled to the second reference voltage $V_2$, the drain of the transistor 334 is coupled to the source of the seventh transistor 131, the source of the transistor 344 is coupled to the second reference voltage $V_2$, the drain of the transistor 344 is coupled to the source of the eighth transistor 14 the gates of the transistor 334 and the transistor 344 are subject to the control of the second control voltage $V_{CTN}$ so as to adjust the value of the ninth bias current and the tenth bias current, thereby further reducing the power consumption of the output stage 304.

The present application also provides a chip, which includes the above-mentioned transconductance amplifier 100/200. The present application also provides an electronic device, which includes the above-mentioned chip. The electronic device may be a handheld electronic device, such as a smart phone, digital personal assistant, hand-held computing system or tablet computer, etc.

The present application embodiment improves the conventional transconductance amplifiers; in particular, it mitigates the error of the transconductance amplifier and increases the linearity thereof by changing the arrangement of the transistors in the input stage. Moreover, the power consumption of the transconductance amplifier can be improved by means of an extra bias current control circuit.

The foregoing outlines the features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. A transconductance amplifier, configured to generate an output current according to a positive input voltage and a negative input voltage, wherein the transconductance amplifier comprises:
   an input stage, configured to receive the positive input voltage and the negative input voltage and generate a positive output current and a negative output current, wherein the input stage comprises:
      a first transistor, wherein a gate thereof is coupled to the positive input voltage;
      a second transistor, wherein a gate thereof is coupled to the negative input voltage;
      a first resistor, serially connected between the first transistor and the second transistor;
      a third transistor, wherein a source of the third transistor is coupled between the first resistor and the first transistor, and a drain of the third transistor is configured to output the positive output current; and
      a fourth transistor, wherein a source of the fourth transistor is coupled between the first resistor and the second transistor, wherein a drain of the fourth transistor is configured to output the negative output current, wherein the first resistor has a first resistance, and a voltage difference between the positive input voltage and the negative input voltage does not affect a source to drain current of the first transistor and a source to drain current of the second transistor, so that a difference between the positive output current and the negative output current is fixed as 2*(the voltage difference between the positive input voltage and the negative input voltage)/the first resistance; and
   an output stage, configured to generate the output current according to the positive output current and the negative output current.

2. The transconductance amplifier of claim 1, wherein the input stage further comprises:
   a first current source, coupled between a first reference voltage and a source of the first transistor, and configured to generate a first bias current, wherein the first bias current flows in a direction from the first reference voltage to the source of the first transistor;
   a second current source, coupled between a second reference voltage and a drain of the first transistor, and configured to generate a second bias current, wherein the second bias current flows in a direction from the drain of the first transistor to the second reference voltage;
   a third current source, coupled between the first reference voltage and a source of the second transistor, and configured to generate a third bias current, wherein the third bias current flows in a direction from the first reference voltage to the source of the second transistor; and
   a fourth current source, coupled between the second reference voltage and a drain of the second transistor, and configured to generate a fourth bias current, wherein the fourth bias current flows in a direction from the drain of the second transistor to the second reference voltage.

3. The transconductance amplifier of claim 2, wherein the first transistor, the second transistor, the third transistor and the fourth transistor are all P-type transistors.

4. The transconductance amplifier of claim 3, wherein the input stage further comprises:
   a fifth transistor, coupled between a gate of the third transistor and the second reference voltage; and
   a sixth transistor, coupled between a gate of the fourth transistor and the second reference voltage.

5. The transconductance amplifier of claim 4, wherein the input stage further comprises:
   a first capacitor, coupled between a gate of the fifth transistor and a drain of the fifth transistor; and
   a second capacitor, coupled between a gate of the sixth transistor and a drain of the sixth transistor.

6. The transconductance amplifier of claim 5, wherein the input stage further comprises:
   a seventh current source, coupled between third reference voltage and the drain of the fifth transistor; and
   an eighth current source, coupled between third reference voltage and the drain of the sixth transistor;
   wherein the third reference voltage is smaller than the first reference voltage and greater than the second reference voltage.

7. The transconductance amplifier of claim 6, wherein the fifth transistor and the sixth transistor are N-type transistors.

8. The transconductance amplifier of claim 7, wherein the output stage comprises:
   a seventh transistor, wherein a source of the seventh transistor is coupled to the drain of the third transistor;
   an eighth transistor, wherein a source of the eighth transistor is coupled to the drain of the fourth transistor;
   a ninth current source, coupled between the source of the seventh transistor and the second reference voltage, and configured to generate a ninth bias current; and
   a tenth current source, coupled between the source of the eighth transistor and the second reference voltage, and configured to generate a tenth bias current.

9. The transconductance amplifier of claim 8, wherein the seventh transistor and the eighth transistor are N-type transistors.

10. The transconductance amplifier of claim 9, further comprising:
    a bias current control circuit, configured to generate a first control voltage according to the positive input voltage and the negative input voltage, wherein the first control voltage is configured to adjust values of a fifth bias current generated by a fifth current source and a sixth bias current generated by a sixth current source.

11. The transconductance amplifier of claim 10, wherein the bias current control circuit is further configured to generate a second control voltage according to the positive input voltage and the negative input voltage, wherein the second control voltage is configured to adjust values of the ninth bias current generated by the ninth current source and the tenth bias current generated by the tenth current source.

12. The transconductance amplifier of claim 11, wherein the bias current control circuit comprises:
    a ninth transistor, wherein a gate thereof is coupled to the positive input voltage;
    a tenth transistor, wherein a gate thereof is coupled to the negative input voltage;
    a second resistor, serially connected between the ninth transistor and the tenth transistor.

13. The transconductance amplifier of claim 12, wherein the bias current control circuit further comprises:
    an eleventh current source, coupled between the first reference voltage and a source of the ninth transistor, and configured to generate an eleventh bias current, wherein the eleventh bias current flows in a direction from the first reference voltage to the source of the ninth transistor;

a twelfth current source, coupled between the second reference voltage and a drain of the ninth transistor, and configured to generate a twelfth bias current, wherein the twelfth bias current flows in a direction from the drain of the ninth transistor to the second reference voltage;

a thirteenth current source, coupled between the first reference voltage and a source of the tenth transistor, and configured to generate a thirteenth bias current, wherein the thirteenth bias current flows in a direction from the first reference voltage to the source of the tenth transistor; and a fourteenth current source, coupled between the second reference voltage and a drain of the tenth transistor, and configured to generate a fourteenth bias current, wherein the fourteenth bias current flows in a direction from the drain of the tenth transistor to the second reference voltage;

wherein the eleventh bias current is greater than and the twelfth bias current, and the thirteenth bias current is greater than the fourteenth bias current.

14. The transconductance amplifier of claim 13, wherein the ninth transistor and the tenth transistor are P-type transistors.

15. A chip, comprising:

a transconductance amplifier configured to generate an output current according to a positive input voltage and a negative input voltage, wherein the transconductance amplifier comprises:

an input stage, configured to receive the positive input voltage and the negative input voltage and generate a positive output current and a negative output current, wherein the input stage comprises:

a first transistor, wherein a gate thereof is coupled to the positive input voltage;

a second transistor, wherein a gate thereof is coupled to the negative input voltage;

a first resistor, serially connected between the first transistor and the second transistor;

a third transistor, wherein a source of the third transistor is coupled between the first resistor and the first transistor, and a drain of the third transistor is configured to output the positive output current; and a fourth transistor, wherein a source of the fourth transistor is coupled between the first resistor and the second transistor, wherein a drain of the fourth transistor is configured to output the negative output current, wherein the first resistor has a first resistance, and a voltage difference between the positive input voltage and the negative input voltage does not affect a source to drain current of the first transistor and a source to drain current of the second transistor, so that a difference between the positive output current and the negative output current is fixed as 2*(the voltage difference between the positive input voltage and the negative input voltage)/the first resistance; and an output stage, configured to generate the output current according to the positive output current and the negative output current.

16. An electronic device, comprising: the chip of claim 15.

* * * * *